(12) United States Patent
Mizuno

(10) Patent No.: US 8,174,707 B2
(45) Date of Patent: May 8, 2012

(54) OPTICAL ELEMENT POSITIONING APPARATUS

(75) Inventor: Makoto Mizuno, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 471 days.

(21) Appl. No.: 12/270,287

(22) Filed: Nov. 13, 2008

(65) Prior Publication Data

US 2009/0128831 A1 May 21, 2009

(30) Foreign Application Priority Data

Nov. 16, 2007 (JP) .................... 2007-298356
Nov. 6, 2008 (JP) .................... 2008-284974

(51) Int. Cl.
*G01B 11/14* (2006.01)
(52) U.S. Cl. ........................................ 356/614
(58) Field of Classification Search .............. 356/614, 356/615, 622
See application file for complete search history.

(56) References Cited

U.S. PATENT DOCUMENTS 6,930,842 B2 * 8/2005 Shibazaki .................... 359/822

FOREIGN PATENT DOCUMENTS

JP 2001-343575 A 12/2001
JP 2005-276933 A 10/2005

* cited by examiner

*Primary Examiner* — Tarifur Chowdhury
*Assistant Examiner* — Tara S Pajoohi
(74) *Attorney, Agent, or Firm* — Canon U.S.A., Inc. IP Division

(57) ABSTRACT

An optical element positioning apparatus of the present invention includes a moving unit including an optical element 2, a drive mechanism 100 configured to drive the moving unit, a position measuring sensor 130 configured to measure a position of the optical element 2, and an optical element controller 10 configured to control the drive mechanism 100 based on a measurement result by the position measuring sensor 130. An incident position (p point) at which a principal ray of a central field enters the optical element 2 is displaced from an optical axis of an optical system including the optical element 2, and the position measuring sensor 130 measures the incident position in an optical axis direction.

4 Claims, 10 Drawing Sheets

ABERRATIONS GENERATED AT RIGHT AND LEFT SIDES ARE ASYMMETRIC

IN CASE WHERE ROTATIONAL CENTER IS OUT OF Y-AXIS

OPTICAL ELEMENT POSITIONING APPARATUS

BACKGROUND OF THE INVENTION

1. Field of the Invention

The present invention relates to an optical element positioning apparatus.

2. Description of the Related Art

A semiconductor exposure apparatus used for the lithography process in manufacturing semiconductor devices or micro devices is an apparatus for transferring an original (a reticle) having a number of different kinds of patterns onto a substrate (a silicon wafer). The integration of the semiconductors is increasing year by year, and reducing the aberration and the distortion of a projection optical system is essential in order to make a circuit pattern with high integration.

In order to reduce the aberration or the distortion of the projection optical system, a part of optical elements of the projection optical system is moved in a plurality of axes directions. Japanese Patent Laid-Open No. 2001-343575 discloses a mechanism for moving in an optical axis direction or a three-axis drive mechanism which can perform a tilt drive as a drive in the plurality of axes directions.

Japanese Patent Laid-Open No. 2005-276933 discloses a displacement reduced type parallel link mechanism which can drive an optical element in six degrees of freedom.

However, since the conventional arts described above include problems as follows, the countermeasure has been desired to be taken.

The driving method disclosed in Japanese Patent Laid-Open No. 2001-343575 is one example where sensors and drive mechanisms are arranged around an optical axis at a distance from the optical axis and at an angular interval equal to one another. When such the driving method is applied to the configuration where a movable optical element is arranged outside the optical axis in an optical system including a reflective optical element, there is a problem that a stroke required for the drive mechanism is large in order to rotate around the point on the optical axis. Even if the drive mechanism in which a driving stroke is large is applied, the driving stroke and the rigidity of the mechanism have a tradeoff relation. Therefore, it is difficult to balance both of them, and there is a problem that a desired disturbance vibration property can not be obtained.

In a method of driving optical element disclosed in Japanese Patent Laid-Open No. 2005-276933, the rotation (pitching and rolling) is performed around the axis passing through the center of gravity of an inner ring (a mirror M1). However, a measurement means includes two axes laser interferometers in a plane direction perpendicular to an optical axis and six capacitance sensors which measure the input amount by an actuator. This apparatus does not directly measure in all axes directions of a moving unit. Therefore, the configuration is not enough to position around the axis passing through the center of gravity with high accuracy. In the case where a reflective projection optical system such as an exposure apparatus using EUV light that is a main field of application of the present invention, an angular positioning error of the optical element (in a direction perpendicular to the optical axis) is sensitive since it is a shift of a light beam. Therefore, a measurement method of an optical element with high accuracy has been desired.

BRIEF SUMMARY OF THE INVENTION

The present invention provides an optical element positioning apparatus in which a measurement position preferable for correcting the aberration coincides with an actual measurement position.

An optical element positioning apparatus as one aspect of the present invention includes a moving unit including the optical element, a driving unit configured to drive the moving unit, a measuring unit configured to measure a position of the optical element, and a control unit configured to control the driving unit based on a measurement result by the measuring unit. An incident position at which a principal ray of a central field enters the optical element is displaced from an optical axis of an optical system including the optical element. The measuring unit measures the incident position in a direction perpendicular to the optical axis.

An optical element positioning apparatus as another aspect of the present invention includes a moving unit including the optical element, a driving unit configured to drive the moving unit, a measuring unit configured to measure a position of the optical element, and a control unit configured to control the driving unit based on a measurement result by the measuring unit. An incident position at which a principal ray of a central field enters the optical element is displaced from an optical axis of an optical system including the optical element. The measuring unit measures the incident position in an optical axis direction based on at least three measurement points.

An optical element positioning apparatus as another aspect of the present invention includes a moving unit including an optical element, a driving unit configured to drive the moving unit, a measuring unit configured to measure a position of the optical element, and a control unit configured to control the driving unit based on a measurement result by the measuring unit. An incident position at which a principal ray of a central field enters the optical element is displaced from an optical axis of an optical system including the optical element. The measuring unit measures a displacement of the incident position in a direction perpendicular to the optical axis.

An optical element positioning apparatus as another aspect of the present invention includes a moving unit including an optical element, a driving unit configured to drive the moving unit, a measuring unit configured to measure a position of the optical element, and a control unit configured to control the driving unit based on a measurement result by the measuring unit. An incident position at which a principal ray of a central field enters the optical element is displaced from an optical axis of an optical system including the optical element. The measuring unit is provided so that a position of center of gravity of a polygon made by projecting at least three measurement points onto a plane perpendicular to the optical axis and a position where the incident position is projected onto the plane coincide with each other. The measuring unit measures the incident position in an optical axis direction based on the at least three measurement points.

An optical element positioning apparatus as another aspect of the present invention includes a moving unit including an optical element, a driving unit configured to drive the moving unit, a measuring unit configured to measure a position of the optical element, and a control unit configured to control the driving unit based on a measurement result by the measuring unit. An incident position at which a principal ray of a central field enters the optical element is displaced from an optical axis along a first direction of an optical system including the optical element toward a second direction which is perpendicular to the first direction. The measuring unit is provided so that a distance between a position of center of gravity of a polygon made by projecting at least three measurement points onto a plane perpendicular to the first direction and a position where the incident position is projected onto the plane is in a range of equal to or less than ¼ of a length of the optical element in a third direction perpendicular to the first and the second directions. The measuring unit measures the incident position in the first direction based on the at least three measurement points.

An optical element positioning apparatus as another aspect of the present invention includes a moving unit including an optical element, a driving unit configured to drive the moving unit, a measuring unit configured to measure a position of the optical element, and a control unit configured to control the driving unit based on a measurement result by the measuring unit. An incident position at which a principal ray of a central field enters the optical element is displaced from an optical axis of an optical system including the optical element. The measuring unit measures the incident position in a direction perpendicular to the optical axis at a measurement point positioned on the same level as that of the incident position with respect to an optical axis direction.

An optical element positioning apparatus as another aspect of the present invention includes a moving unit including an optical element, a driving unit configured to drive the moving unit, a measuring unit configured to measure a position of the optical element, and a control unit configured to control the driving unit based on a measurement result by the measuring unit. An incident position at which a principal ray of a central field enters the optical element is displaced from an optical axis of an optical system including the optical element. The measuring unit measures the incident position in a direction perpendicular to the optical axis at a measurement point whose level is different by 60 mm at a maximum from that of the incident position with respect to an optical axis direction.

Further features and aspects of the present invention will become apparent from the following description of exemplary embodiments with reference to the attached drawings.

DETAILED DESCRIPTION OF THE PREFERRED EMBODIMENTS

Exemplary embodiments of the present invention will be described below with reference to the accompanied drawings.

Figure 1:
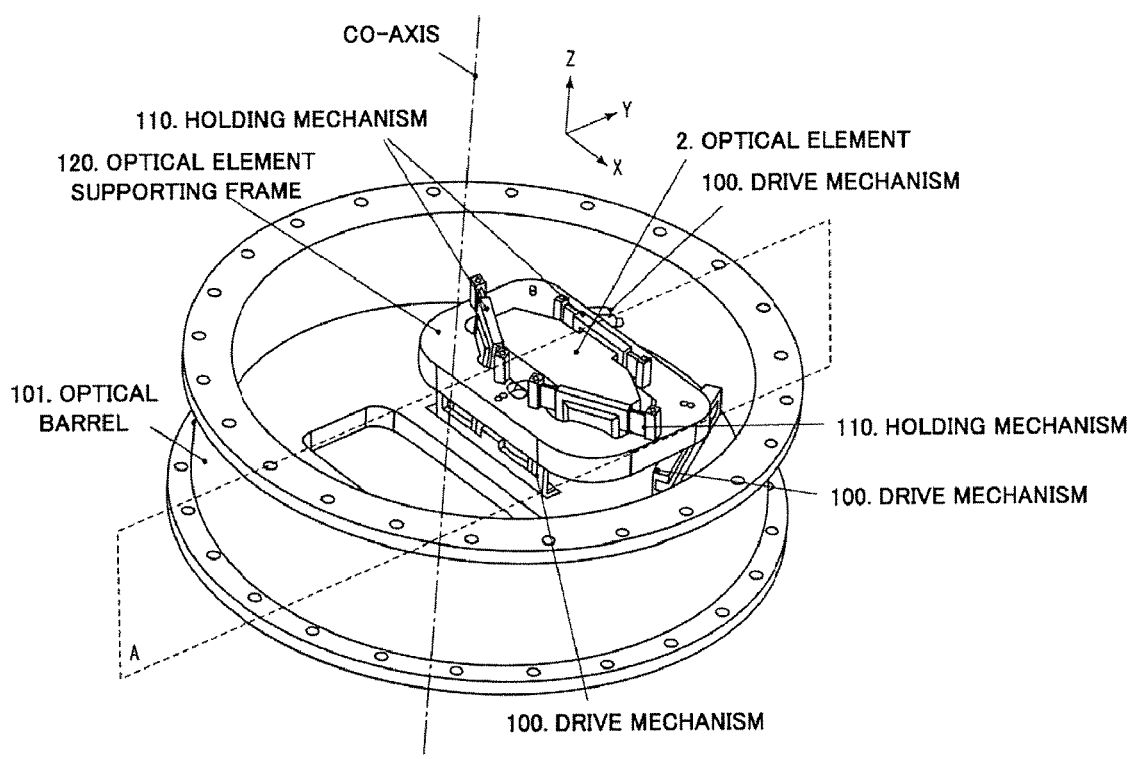
FIG. 1 is a schematic view of an optical element positioning apparatus of the present embodiment.
Figure 2:
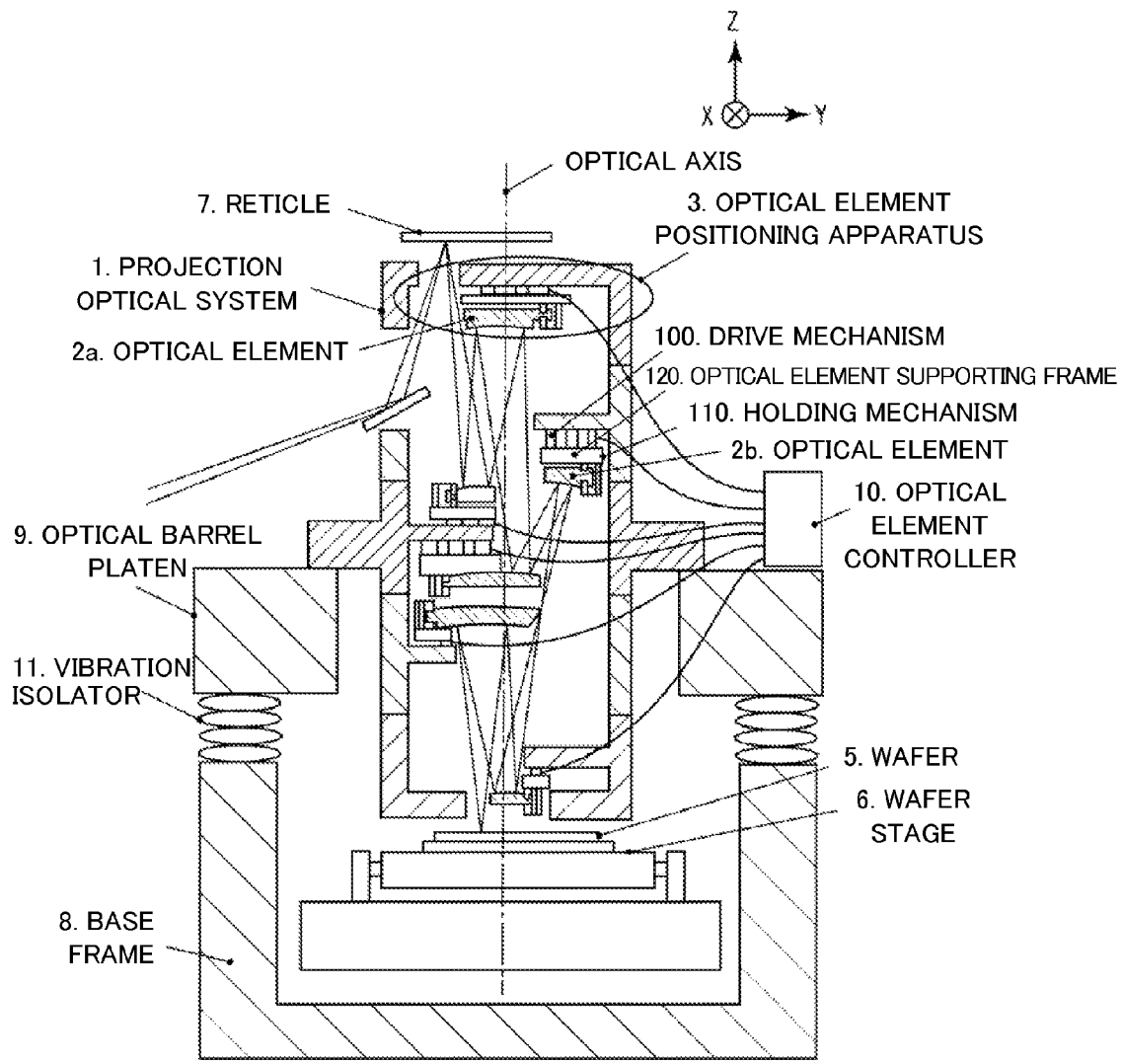
FIG. 2 is an overall view of a semiconductor exposure apparatus which is equipped with a drive mechanism of the present embodiment.

FIG. 1 is a schematic view showing an optical element positioning apparatus relating to the embodiment of the present invention. FIG. 2 is a diagram showing an example of the schematic configuration of a semiconductor exposure apparatus to which the present embodiment is applied.

The exposure apparatus of the present embodiment is a projection exposure apparatus which exposes a circuit pattern formed on a reticle 7 onto a wafer 5 by a step-and-scan method, a step-and-repeat method, or the like, using EUV light (for example, the wavelength is 13.4 nm) as an illumination light for exposure. An example where a drive mechanism of the present embodiment is applied to the exposure apparatus using the EUV light will be described as follows. However, the optical element positioning apparatus described in the present embodiment can also be applied to an exposure apparatus using other light sources such as KrF, ArF, and F2.

Such exposure apparatuses of the present embodiment are preferably used for a lithography process of a sub-micron, a quarter-micron, or smaller process. In the present embodiment, an exposure apparatus of a step-and-scan method (also called a "scanner") will be described as one example.

As shown in FIG. 2, the exposure apparatus of the present embodiment includes an illumination apparatus (not shown), a reticle stage (not shown) which is configured to place a reticle 7, a wafer stage 6 which is configured to place a wafer 5, and a projection optical system 1 which forms an image of the reticle 7 described above on the wafer 5.

Since the EUV light is low in transmittance with respect to the air, an optical path in which the EUV light passes or a whole optical system is in a state of a vacuum atmosphere.

The reticle 7 is reflective. A circuit pattern or an image to be transferred is formed on the reticle 7. This reticle 7 is supported and fixed on the reticle stage using an electrostatic chuck or the like, and is driven integrally with the reticle stage. Diffracted light from the reticle 7 is reflected by a projection optical system 1 and is projected on the wafer 5. The reticle 7 and the wafer 5 are arranged in an optically conjugate relation. The exposure apparatus of the present embodiment is an exposure apparatus by a step-and-scan method. Therefore, the exposure apparatus performs a reduced projection of the pattern of the reticle 7 on the wafer 5 by scanning the reticle 7 and the wafer 5.

The projection optical system 1 performs a reduced projection of the pattern on the surface of the reticle 7 on the wafer 5 that is an image plane using a plurality of reflective mirrors (optical components) 2a and 2b, or multilayer mirrors. The number of the plurality of mirrors is, for example, around four to eight. In FIG. 2, a mirror system that has six mirrors is shown. In order to realize a wide exposure area with mirrors of a small number of around four to eight, the pattern is transferred using only a thin circular-arc area (a ring field) at a certain distance from an optical axis and scanning the reticle 7 and the wafer 5 at the same time. The number of mirrors are preferably even such as four, six, or eight. A numerical aperture (NA) of the projection optical system 1 is around 0.2 to 0.5.

In order to prevent the vibration of the floor on which the exposure apparatus is set up from transmitting to the projection optical system 1 and further each of mirrors of the inside, an optical barrel platen 9 and a base frame 8 are connected via a vibration isolator 11.

Reference numeral 10 denotes an optical element controller. The optical element controller 10 controls an optical element drive mechanism of the present embodiment in accordance with the predetermined control flow. The optical element controller 10 is a control unit which controls a drive mechanism 100 based on a result measured by a position measuring sensor 130. Specifically, the optical element controller 10 optimizes the optical performance of the projection optical system 1 by supplying a command to the drive mechanism based on a result calculated so that an error amount such as a magnification error obtained from an exposure aberration or alignment information is minimized and based on a program previously stored, and by driving to adjust a predetermined optical element (e.g., 2a or 2b in FIG. 2).

Figure 8:
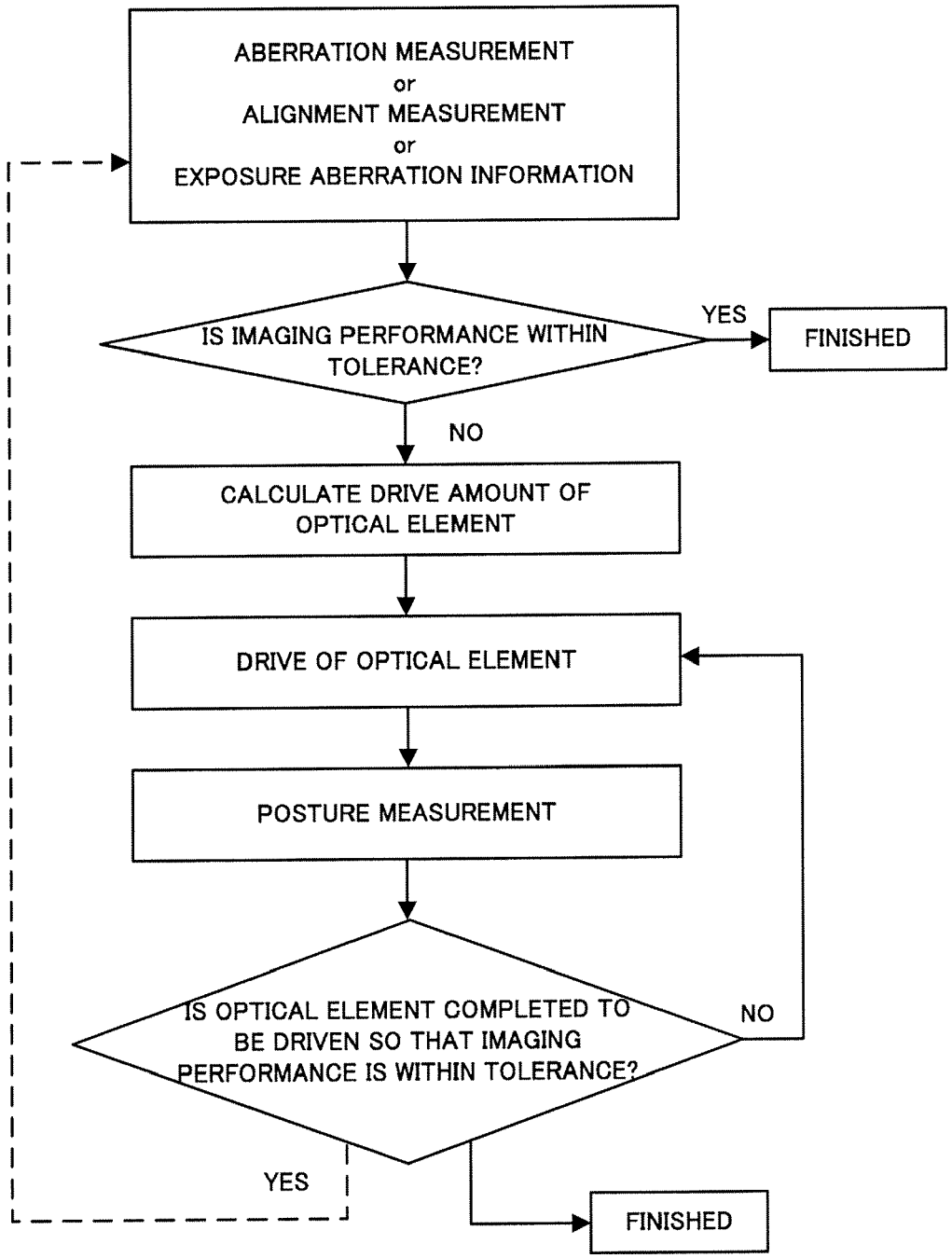
FIG. 8 is a diagram showing a flow of the correction of the optical performance in an optical element positioning apparatus of the present embodiment.

FIG. 8 shows the flow. FIG. 8 is depicted considering both the cases where the aberration adjustment is performed when the exposure apparatus is in operation and where the assembling adjustment of the projection optical system is performed. For example, when the assembling adjustment of the projection optical system is performed, a wavefront aberration measurement or the like can be performed again after the optical element is driven to be adjusted. Therefore, in this case, the optical element can be driven to be adjusted again based on the result. As a result, the route represented by the dotted line can be followed. When the exposure apparatus is in operation, in many cases, the optical performance can not be reviewed again. In this case, generally, the flow is completed if it is confirmed that the driving position is within a desired position.

FIG. 1 is a part of the projection optical system 1 shown in FIG. 2 and is one example of an optical element positioning apparatus 3. From the view of FIG. 1, in this system, the center of mass of the optical element 2 is clearly away from a co-axis. The optical element positioning apparatus 3 includes an optical element 2, a holding mechanism 110, an optical element supporting frame 120, a drive mechanism 100, and a position measuring sensor 130 (shown in FIG. 7) as a measuring unit which measures the position (displacement) of the optical element 2.

The optical element positioning apparatus 3 is fixed on an optical barrel 101. However, instead of this, the configuration where the optical element positioning apparatus 3 is incorporated in the base plate and further the optical barrel 101 and the base plate are combined can also be adopted. In this case, it is more preferable in that the maintenance or the assembling adjustment of the optical element positioning apparatus 3 and further the process for modifying the optical element 2 can be easily performed.

The drive mechanism 100 is a driving unit which drives a moving unit including the optical element 2, the holding mechanism 110, and the optical element supporting frame 120 so as to adjust the position in a plurality of axes directions. By adjusting the position of the optical element 2 with high accuracy, the projection optical system 1 can obtain an optimal imaging performance.

It is preferable that the optical element positioning apparatus 3 can drive the moving unit in perpendicular three axes and in rotational three axes around the perpendicular three axes, or in the sum of six-axis directions. In order to realize to drive in the six-axis directions, it is preferable that a parallel rink mechanism of Stewart Platform type or the like is used. As an actuator of the drive mechanism 100, a stacked piezo actuator is preferably used.

The holding mechanism 110 is used for reducing the heat distortion of the optical element 2 generated by the exposure, for reducing the deformation of the optical element 2 at the time of assembling, and for preventing an external force caused by the drive of the drive mechanism 100 from transmitting to the optical element 2.

As shown FIG. 1, one end of the drive mechanism 100 is attached to the optical barrel 101, and the other end is connected to the optical element supporting frame 120.

The holding mechanism 110 is constituted for reducing the external force supplied mainly from the optical element supporting frame 120 to the optical element 2 or the deformation by the heat distortion, or for obtaining the reproducibility of the surface shape of the optical element 2 in accordance with starting over the assembling or the like. The holding mechanism 110 shown in FIG. 1 is one example.

When the position of the optical element 2 is adjusted with high accuracy, it is more preferable that a position measuring sensor 130 is used. In the case where there is a mechanism that adjusts the posture of the optical element 2 in six-axis directions like the present embodiment, at least six position measuring sensors 130 are necessary. Commonly, six displacement sensors are arranged around the object to be measured. If the holding mechanism 110 and the optical element supporting frame 120 are enough rigid, the posture of the optical element 2 can be considered to have been measured by arranging the position measuring sensors 130 around the optical element supporting frame 120. However, the holding mechanism 110 having a good deformation interception property is not always enough rigid.

If the optical element 2 is connected by the holding mechanism 110 which is enough rigid, the postures of the optical element 2 and the optical element supporting frame 120 can be considered identical. On the other hand, in the case where the holding mechanism 110 is not enough rigid, the postures of the optical element 2 and the optical element supporting frame 120 are not identical at the level of the optically required accuracy, for example, of around 1 nm. Therefore, it is preferable that the posture of the optical element 2 is directly measured by the position measuring sensor 130.

Figures 3A, 3B, 3C:
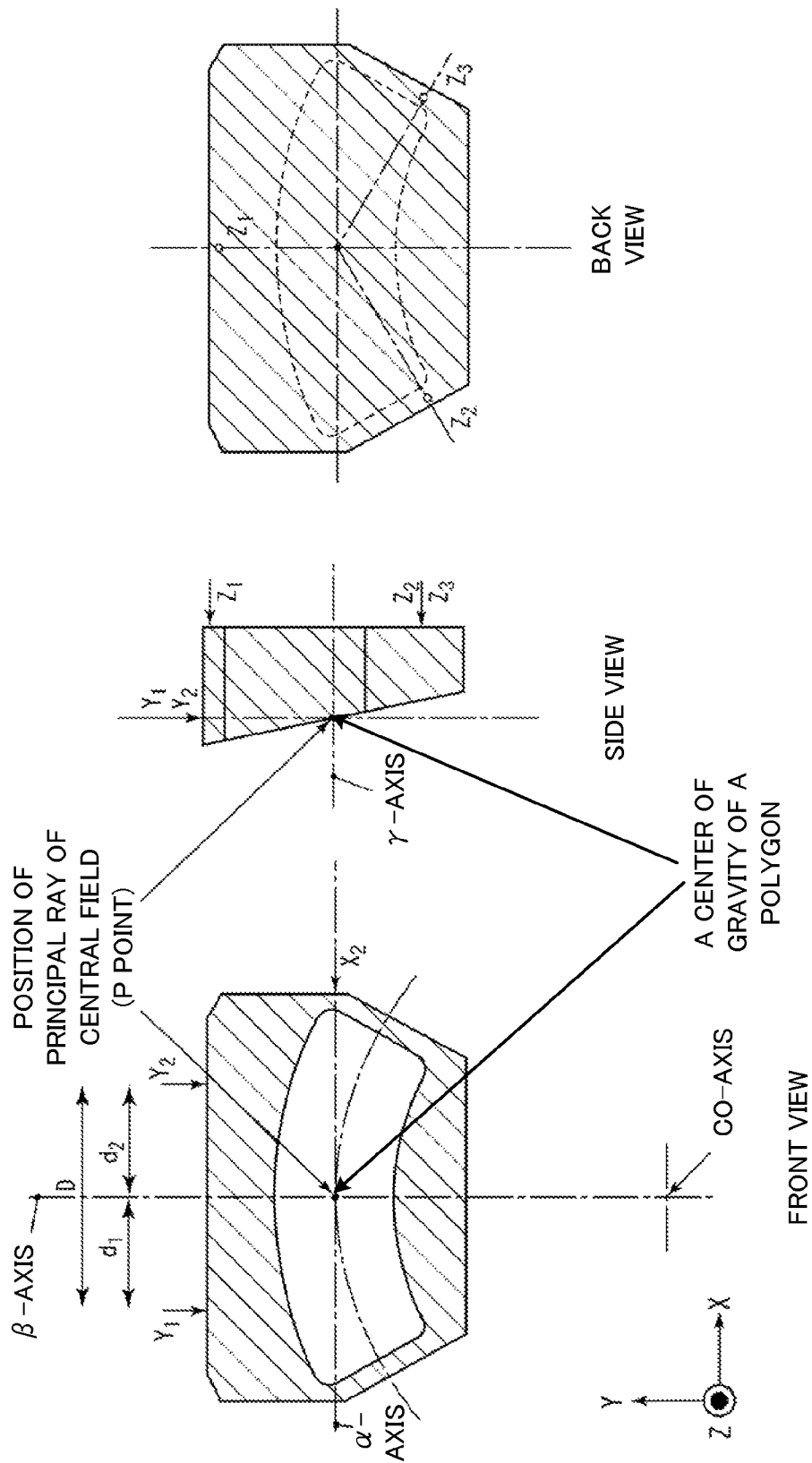
FIGS. 3A to 3C are a schematic view showing a measurement point of an optical element positioning apparatus of the present embodiment.

The arrangement of the position measuring sensor 130 is not free, and there is an arrangement of the sensor for reducing the influence on the imaging performance. FIGS. 3A to 3C are one example showing a position measuring method of a certain optical element 2. FIG. 3A shows a surface of the optical element 2 at a side where exposure light is irradiated, FIG. 3B shows a side surface, and FIG. 3C shows a back surface of the optical element 2.

Figure 4:
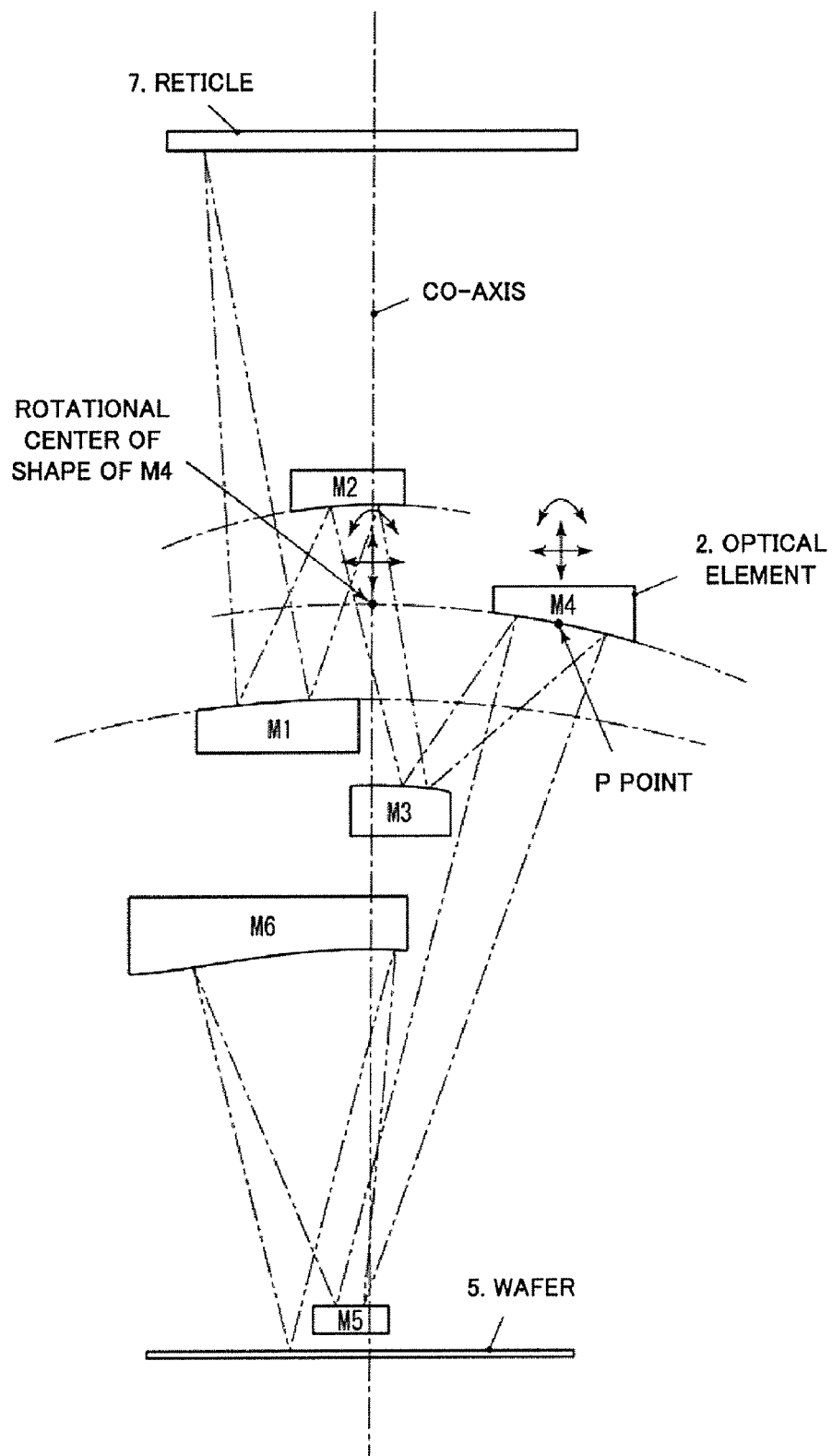
FIG. 4 is a diagram showing a rotational center of the drive of an optical element of the present embodiment.

The area where the exposure light is irradiated is shown in the surface of the optical element of FIG. 3A. When the exposure aberration generated by the exposure heat and the like need to be corrected or the magnification component obtained by the alignment measurement and the like need to be adjusted, in the system where an optical element exists symmetrically in all circumferences with respect to the optical axis, the optical element 2 is rotated around a certain point on the optical axis or translated. However, as shown in FIG. 4, in the case where the optical element 2 exists only at a part away from the optical axis or the co-axis and the drive mechanism 100 are positioned around it, if the optical element 2 is rotated around the point on the optical axis, the movement distance required for the drive mechanism 100 is large.

The drive mechanism 100 which can realize a large movement distance can not easily obtain a high rigidity, and the vibration property from the outside may get worse and the imaging performance may decrease. Therefore, as shown in FIG. 4, in the case of the optical element positioning apparatus 3 in which the optical element 2 exists at a position distant from the co-axis, it is preferable that the optical element 2 is rotated around the vicinity of the optical element 2. In the embodiment, the correction of the optical aberration is performed by driving a mirror M4 as the optical element 2.

As far as the control is concerned, it is preferable that the drive mechanism 100 is evenly positioned with respect to the center of gravity of the moving unit (the optical element 2, the holding mechanism 110, and the optical element supporting frame 120). The word "evenly" means that the drive mechanism 100 is positioned so that the incenter of the triangle formed by the three parts which are the contacts of the drive mechanism 100 and the optical element supporting frame 120 coincides with the center of gravity of the moving unit. As shown in FIG. 3A, if the shape of the moving unit is substantially symmetrical with respect to the Y-axis, the center of gravity is at the vicinity of the Y-axis. However, in the case where the symmetry is broken by arranging the position measuring sensor 130 asymmetrically with respect to the Y-axis or the symmetry is changed to the asymmetry because of the space limitation for other structures in the projection optical system 1, the center of gravity of the moving unit is out of the Y-axis.

Figure 5A:
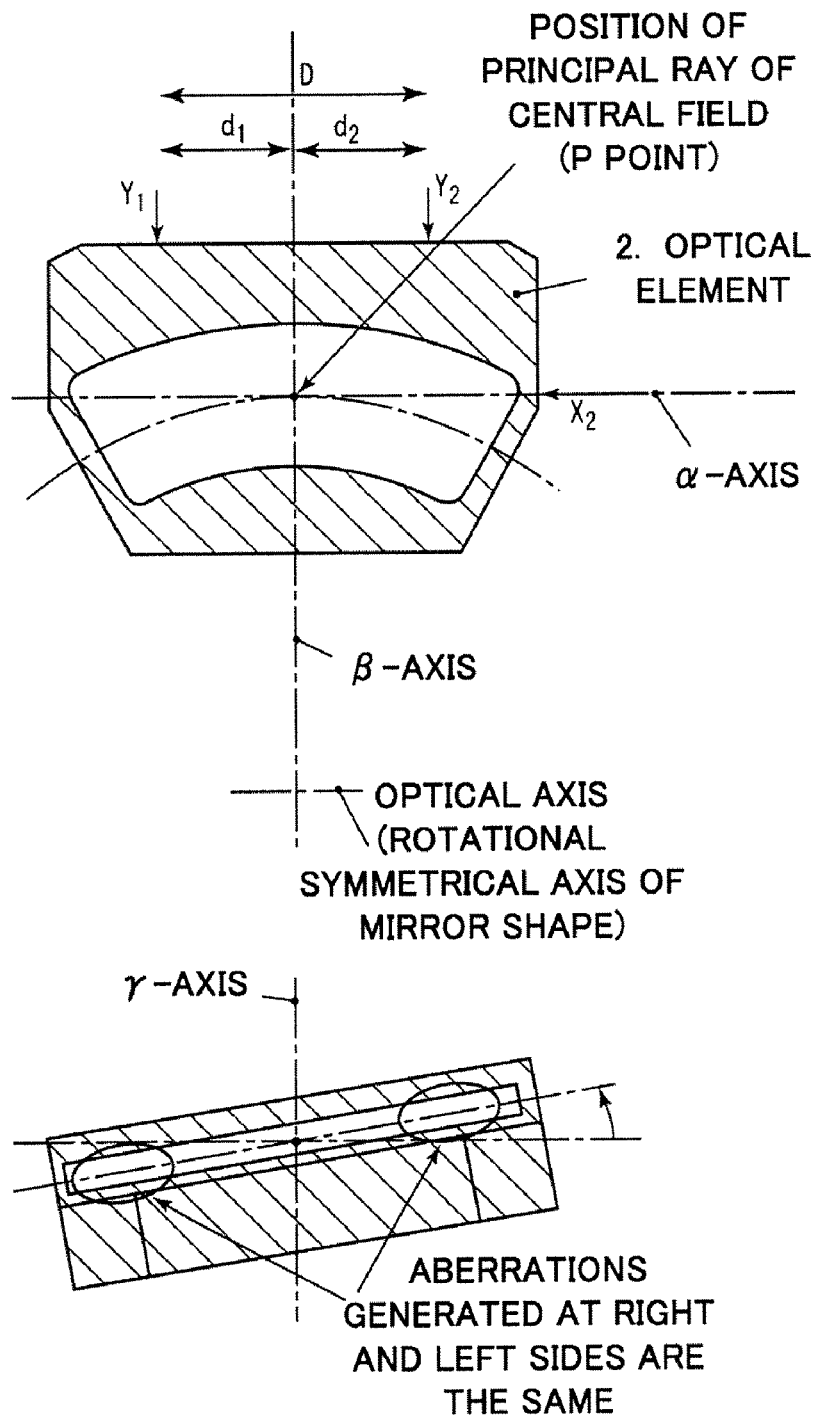
FIGS. 5A and 5B are a diagram showing a rotational center of an optical element and an error of the present embodiment.
Figure 5B:
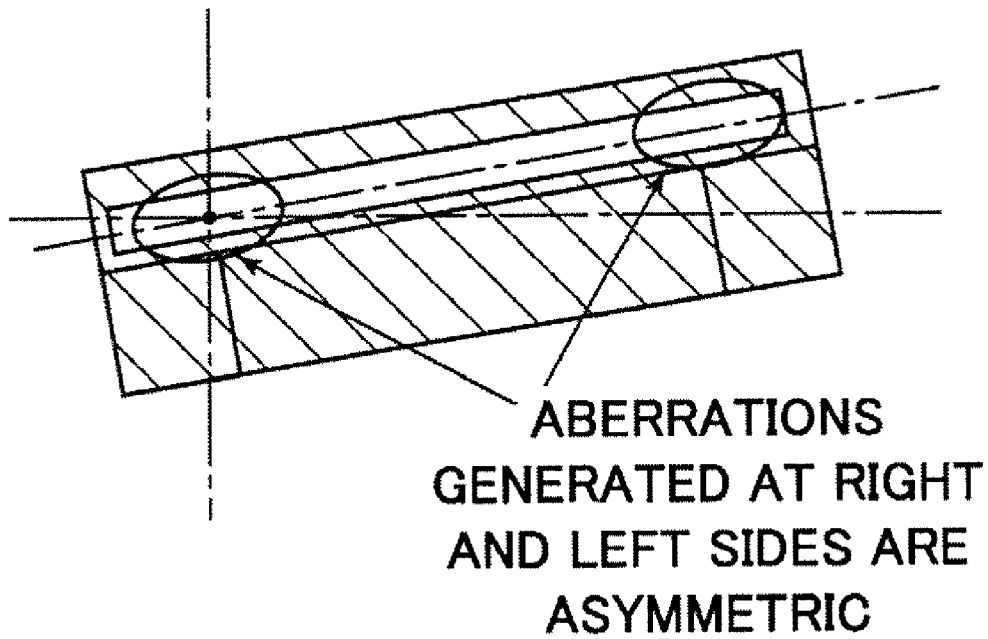

On the other hand, from the viewpoint of the optical design, it is preferable that the optical element 2 is rotated so that the movement error of the center of the area where the exposure light is irradiated is minimized (see FIG. 5A). The words of "the center of the area where the exposure light is irradiated" mean an incident position where the principal ray of the central field enters the optical element, and it is hereinafter referred to as a "p point". As shown in FIG. 5B, if the rotation around the Y-axis direction is performed around the point distant from the Y-axis instead of the p point, the aberration is changed in accordance with the right or the left side of the rotational axis and it is difficult to make an arrangement. Therefore, it is preferable that the position measuring sensor 130 is positioned so that the measurement error is not generated at the p point. In the embodiment, in order to distinguish with the X, Y, and Z-axes defined at the center of the co-axis or the optical axis, a locally perpendicular coordinate system around the p point is defined as $\alpha$, $\beta$, and $\gamma$. The $\alpha$, $\beta$, and $\gamma$-axes are parallel to the X, Y, and Z-axis, respectively. In the embodiment, the $\beta$-axis coincides with the Y-axis.

In the example of FIG. 3A, in order to perform a shift measurement in the $\beta$ direction and an angular measurement around the $\gamma$-axis, two position measuring sensors 130 for measuring two measurement points Y1 and Y2 are arranged at a distance D. These position measuring sensors measure the measurement points Y1 and Y2 which are positioned on the same level as that of the p point with respect to a direction along the optical axis (a first direction) so as not to generate an error in measuring the p point. The measurement points Y1 and Y2 are arranged so that the distances d1 and d2 (d1+d2=D) from the p point in the $\alpha$-axis direction are equal to each other. Therefore, according to such the arrangement, the shift measurement in the $\alpha$-axis direction can also be measured using the measurement points Y1 and Y2.

Furthermore, in order to perform the shift measurement in the $\alpha$-axis direction, the position measuring sensor 130 which measures the measurement point X2 is provided. For the reason above, the position measuring sensor also measures the measurement point X2 positioned on the same level as that of the p point with respect to the optical axis direction.

As described above, it is preferable that each of the measurement points Y1, Y2, and X2 of the position measuring sensors which performs the measurement in the $\alpha$ and $\beta$-axes directions is positioned on the same level as that of the p point with respect to the optical axis. However, it is sometimes difficult to be set to the same height in the space arrangement because of the interference with other units or parts and the like. In this case, the same effect can be obtained by previously measuring the heights of the p point and the measurement point of the position measuring sensor with a three-dimensional measuring equipment for example and by performing a conversion using the value. It is sometimes difficult to directly measure the p point since the p point is on a reflective surface. In this case, the measurement of the p point can be achieved using a surface shape measuring apparatus by identifying the position of the p point, calculating the distance from the base surface of the optical element 2 (for example, a back surface with respect to the reflective surface of the optical element 2), and measuring the base surface and the measurement point of the position measuring sensor. Thus, the position measuring sensor does not have to directly measure the position (displacement) of the p point if it measures the position (displacement) of the p point in a perpendicular direction (a second direction) with respect to the optical axis direction (a first direction).

On the other hand, the shift in the $\gamma$-axis direction and the rotational angle around the $\alpha$ and $\beta$-axes are measured by arranging three position measuring sensors 130 around the optical element 2. In this case, it is preferable that the three position measuring sensors 130 are evenly positioned with respect to the p point in a plane perpendicular to the $\gamma$-axis. The words "evenly positioned" mean that the center of gravity of the triangle formed by the measurement points of the three position measuring sensors 130 in the Z direction coincides with the p point in the case where the center of gravity and the p point are projected onto a certain plane perpendicular to the optical axis.

Figure 7:
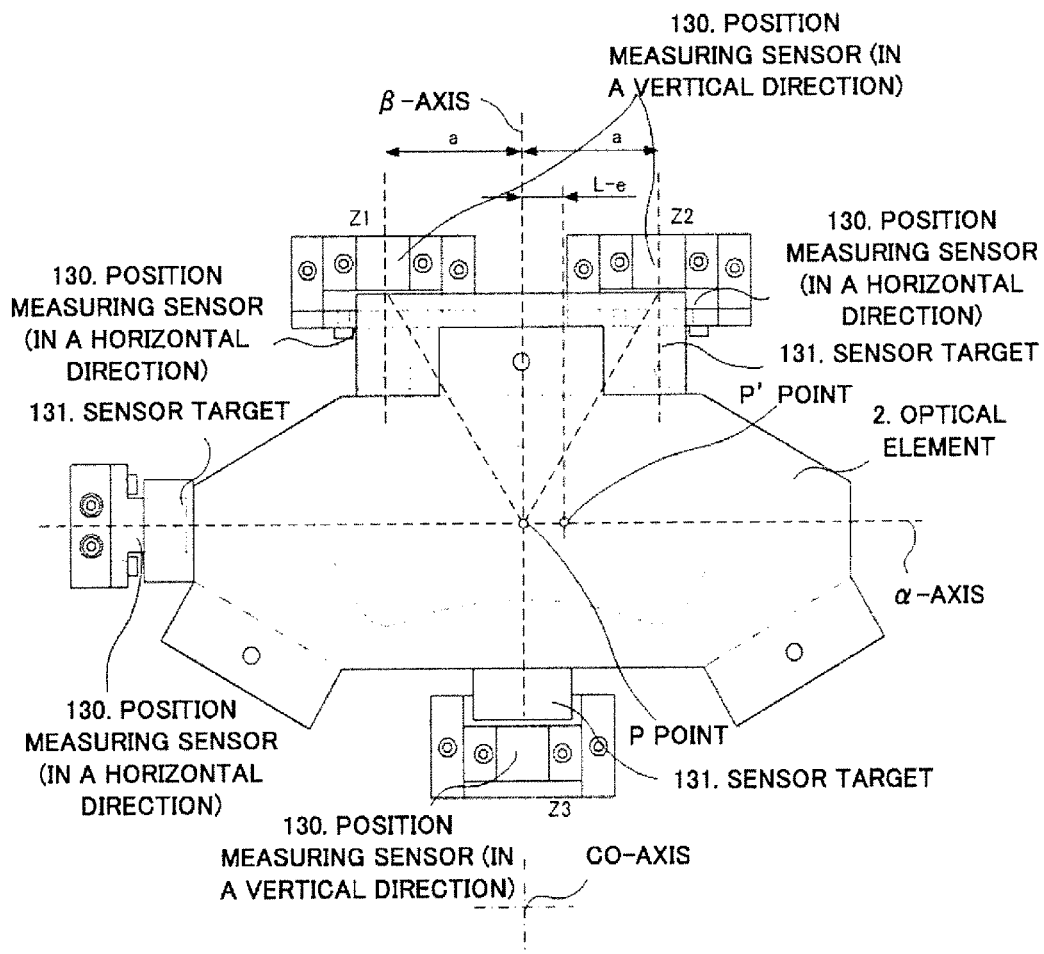
FIG. 7 is a diagram showing an example of a specific arrangement of a measuring system in an optical element positioning apparatus of the present embodiment.

In other words, the line connecting the center of gravity and the p point is parallel to the co-axis. The words "the center of gravity coincides with the p point" are not limited to the case where the center of gravity completely coincides with the p point. From the viewpoint of the optical performance, the words include the case where the center of gravity and the p point are in the vicinity in the range of equal to or shorter than ¼ of the length of the optical element 2 in the $\alpha$-axis direction. This will be described with reference to FIG. 7. It assumes that the relation of three position measuring sensors 130 is not as shown in FIG. 7, but the three position measuring sensors 130 are mounted at an arbitrary position, and that the center of gravity of the triangle formed by the position measuring sensors is p' point. In this case, the position of the p' point in the $\alpha$-axis direction is L-e ("e" is an error amount) from the p point because of the measurement error or the like. When the rotational error amount around the p-axis in accordance with the drive in the perpendicular direction is calculated using L and e, in the case where L=100 mm, Z drive amount is equal to 0.01 mm, and e=0.03 mm for example, the rotational error amount is equal to or greater than 50 nrad if the distance between the center of gravity and the p' point is greater than ¼ of the length of the mirror in the $\alpha$-axis direction, and in many case, it is unacceptable. It is because the aberration and the position displacement are deteriorated as the angular error amount is greater although it depends upon the sensitivity of the intended optical element.

Thus, it is preferable that the three position measuring sensors 130 are provided so that a position of the center of gravity of the polygon formed by projecting at least three measurement points Z1, Z2, and Z3 onto a plane perpendicular to the optical axis coincides with a position where the p point is projected onto the plane. These positions have only to coincide with each other in the range of equal to or shorter than ¼ of the length of the optical element 2 in a third direction (the $\alpha$-axis direction) perpendicular to the first direction and the second direction.

As described above, it is preferable that the measurement points Z1, Z2, and Z3 of the position measuring sensors which make measurements in the $\gamma$-axis direction are arranged so that the center of gravity of the triangle formed by the measurement points projected on the plane perpendicular to the $\gamma$-axis coincides with the p point. However, because of the space limitation, it is sometimes difficult to make such the arrangement. In this case, the same effect can be obtained by previously measuring the p point and the measurement point of each sensor with a three-dimensional measuring equipment for example and by performing a conversion using the value. Thus, the positions of the center of gravity and the p point do not have to coincide with each other if the position (displacement) of the p point in the perpendicular direction (the second direction) with respect to the optical axis (the first direction) is measured based on at least the three measurement points.

As can be seen from FIG. 3A, the optical element 2 exists only at a part distant from the co-axis. In other words, the shift measurement in the p-axis direction (Y1 and Y2 in the example of FIG. 3A) in the case where the center of mass of the optical element exists outside the co-axis is preferably performed by arranging the position measuring sensor 130 at the side distant from the co-axis. It is because the optical element 2 does not exist at the height of the p point at the side closer to the co-axis of the optical element 2.

Figure 6:
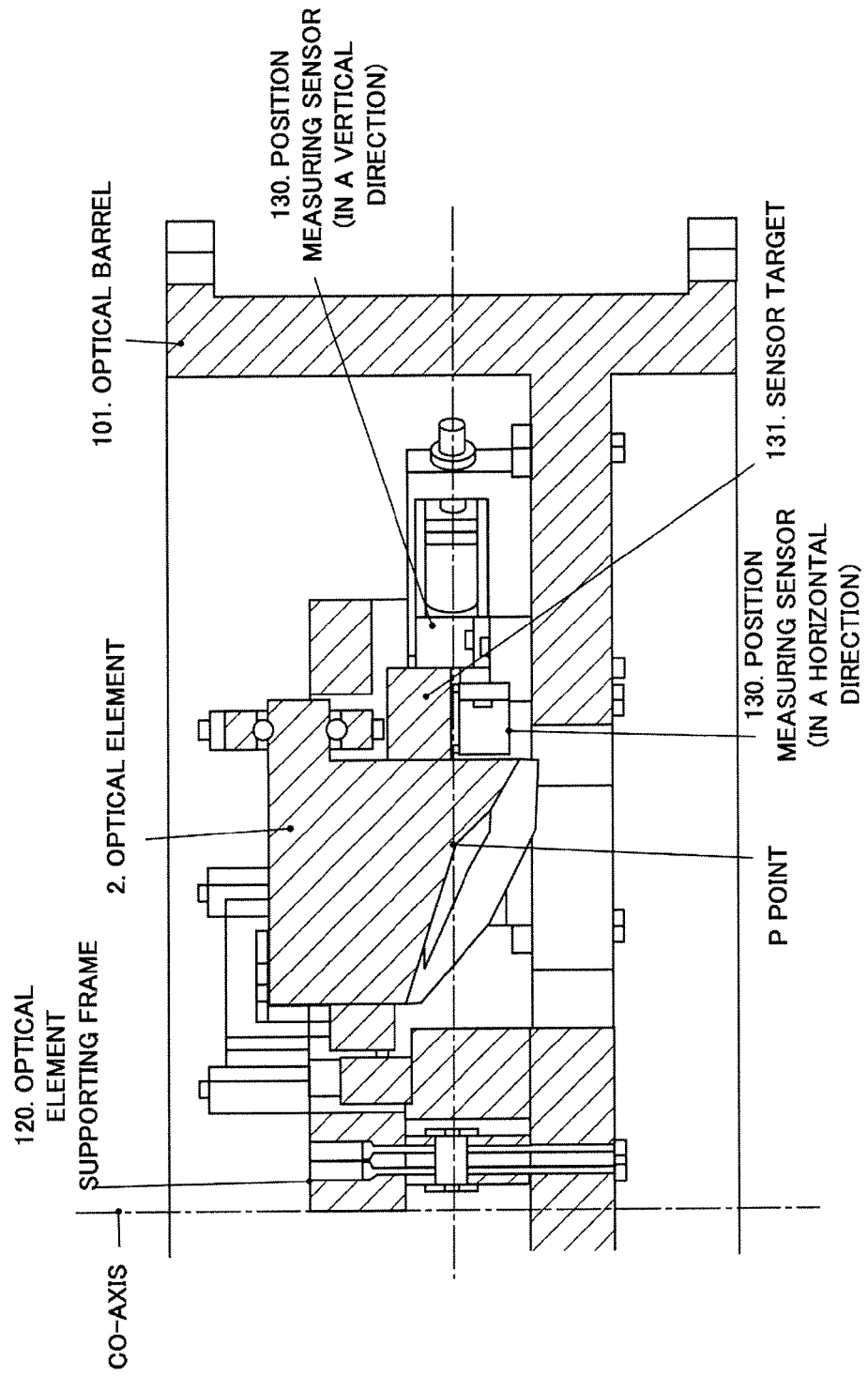
FIG. 6 is a partial cross-sectional view of an optical element positioning apparatus of the present embodiment.

FIG. 6 shows the cross-sectional view of the optical element positioning apparatus represented as A shown in FIG. 1. It is an example where the position measuring sensor (a horizontal direction) 130 is positioned so that the shift measurement in the horizontal direction can be performed at the height in a Z direction (emphasized by a dotted line) identical to the center of the area (the p point) where the exposure light is irradiated on the optical element 2, which is only positioned at a part distant from the co-axis, having a concave surface in a minus Z direction. If the displacement measurement in the perpendicular direction is not performed at the height identical to the p point in the Z direction, the measurement error is easily caused by the influence of a rotational component by the amount of the discrepancy. The configuration in which the rotational component is measured by other sensors as described above is considered. Thus, if the measurement value of the rotational component is correct and the height in the Z direction in measuring in the horizontal direction is previously exactly known, it can be converted to the displacement in the horizontal direction of the p point. In this case, the displacement measurement in the horizontal direction does not have to be performed at the same height in the Z direction as that of the p point. However, actually, the height in the Z direction in performing a measurement in the horizontal direction and the angular measurement value contain an error. Therefore, it is preferable that the misalignment from the p point is within 60 mm, considering the optical sensitivity.

The position measuring sensor 130 shown in FIG. 6 is an example in the case of using a linear encoder. A sensor target 131 as a measurement target of the position measuring sensor 130 is formed by a method, for example, of bonding a scale which is capable of being measured by the linear encoder at a part of the optical element 2, performing an optical contact, fixing screws, and mechanically processing, before forming a film.

Since the sensor target 131 or the base (base material) is directly connected to the optical element 2, it is preferable that its coefficient of thermal expansion is the same as that of the optical element 2. From this viewpoint, it is more preferable that the optical element 2 and the sensor target 131 (or the base) are made up of the same material.

There are at least three position measuring sensors 130 for performing the positioning measurement in the horizontal direction. It is preferable that the virtual straight line showing one measurement direction among them passes through the center of the area where the exposure light is irradiated (the p point). In other words, at least one of the virtual straight lines showing the measurement direction for measuring the position (displacement) of the incident position (the p point) in the second direction or the third direction passes through the incident position (the p point) of the optical element 2. As shown in FIG. 3A, the virtual straight line is a line extending along the α-axis direction from the measurement point X2.

The virtual straight lines that do not pass through the p point showing at least two measurement directions among at least the three position measuring sensors 130 performing a position measurement in the horizontal direction are preferably parallel to each other. In other words, at least two among the virtual straight lines showing the measurement direction for measuring the position (displacement) of the incident position (the p point) in the direction along the optical axis (the first direction) are parallel to each other. As shown in FIG. 3A, the virtual straight lines are lines extending along the β-direction from the measurement points Y1 and Y2. Thus, an Abbe error is resistant to being generated when performing a measurement in the horizontal direction. Therefore, the positioning apparatus can be driven with high accuracy.

In the embodiment, an example where a linear scale is used also for the posture measurement in a perpendicular direction is shown. A position measuring sensor 130 (in a perpendicular direction) is provided in a direction substantially perpendicular to the sensor in the horizontal direction. A target is provided so as to face the sensor similarly described above.

FIG. 6 shows an example where a linear scale is used as a position measuring sensor 130. However, a sensor based on another principle such as a laser interferometer, a capacitance displacement sensor, an eddy current displacement sensor, or a differential transformer may be used. In the embodiment, the example of their application is not shown.

FIG. 7 is a perspective view of the optical element positioning apparatus shown in FIG. 1 or a plan view from the co-axis direction in the cross-sectional view shown in FIG. 6. The arrangement of total six position measuring sensors, i.e. one position measuring sensor 130 for performing the shift measurement in the α-axis direction, two position measuring sensors 130 for performing the shift measurement in the β-axis direction and the angular measurement around the γ-axis direction, and three position measuring sensors 130 for performing the shift measurement in the γ-axis direction and the angular measurement around the α-axis and the β-axis directions, is shown. The two position measuring sensors 130 for performing the shift measurement in the β-axis direction are arranged at the same distance with respect to the Y-axis so that the error is resistant to being generated in measuring the position (displacement) of the p point. The position measuring sensor 130 for the measurement in the X-axis direction provides the same effect by the arrangement on the X-axis. The arrangement of the position measuring sensors 130 in the α-axis and the β-axis may be replaced each other.

It is preferable that the triangle which is formed by the measurement points of the three position measuring sensors 130 in the γ-axis direction is an isosceles triangle or an equilateral triangle. It is because either angular measuring resolution is deteriorated if the shape of the triangle described above is distorted in converting the values of the three sensors into the rotational angles around the α-axis and the β-axis. If both of the angular measuring resolutions are expected to be equal to each other, it is preferable that the triangle is an isosceles triangle of $\sqrt{5}:\sqrt{5}:1$.

In the description of the embodiment, the position measuring sensor 130 for measuring the shift in the γ-axis direction and the rotational angle around the α-axis and the β-axis includes three sensors. However, it can also be considered that increasing the number of the position measuring sensors 130 so as to be highly accurate by the averaging effect although it may be redundant. In this case, the geometric configuration formed by the measurement points is not a triangle but a polygon in accordance with the number of the position measuring sensors 130.

Figure 9:
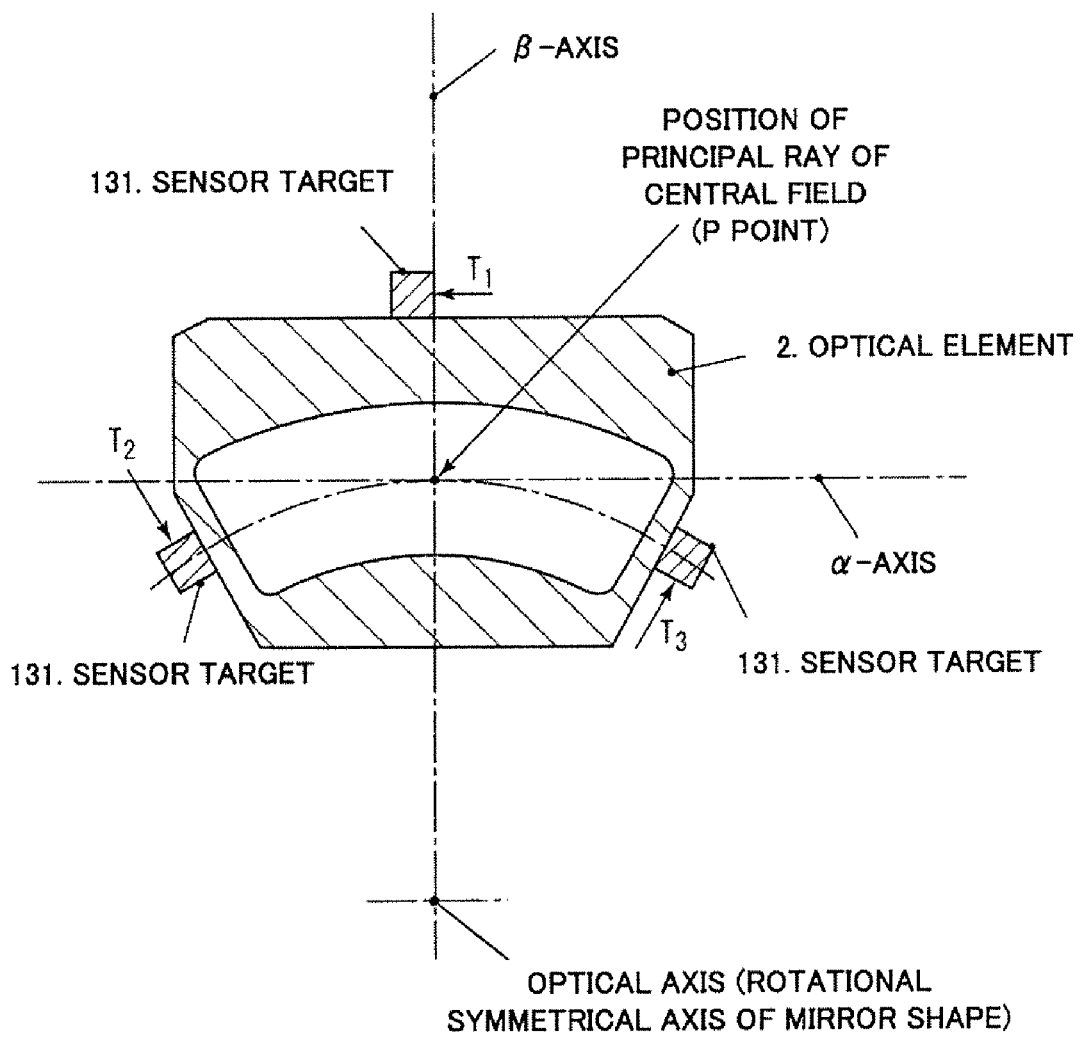
FIG. 9 is a diagram showing another example of an arrangement of a horizontal direction sensor in an optical element positioning apparatus of the present embodiment.

In the present embodiment, each of the position measuring sensors 130 for performing the position measurement in the horizontal direction is arranged along the α-axis or the β-axis. However, as shown in FIG. 9, the position measuring sensors 130 in the horizontal direction may be arranged in a substantially tangential direction with respect to a certain circle around the p point to perform the measurement in three directions T1, T2, and T3.

In the embodiment described above, a mirror is provided as an example of the optical element. However, the object to be controlled to be driven by the positioning apparatus of the present embodiment is not limited to the mirror. For example, a lens, a parallel plate glass, a prism, or a diffraction optical element such as a binary optics may be used.

As described above, according to the present embodiment, an optical element positioning apparatus in which a measurement position preferable for correcting the aberration coincides with an actual measurement position can be provided. Therefore, an optical element positioning apparatus that is resistant to influencing the optical image performance can be realized. Furthermore, according to the present embodiment, since the positioning of the optical element is performed at a position where the aberration is resistant to being generated as a center, a projection optical system in which the image property is preferable can be realized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-298356, filed on Nov. 16, 2007 and Japanese Patent Application No. 2008-284974, filed on Nov. 6, 2008, which are hereby incorporated by reference herein in their entirety.

What is claimed is:

1. An optical element positioning apparatus comprising:
a moving unit including a mirror;
a driving unit configured to drive the moving unit;
a measuring unit configured to measure a position of the mirror; and
a control unit configured to control the driving unit based on a measurement result by the measuring unit,
wherein an incident position at which a principal ray of a central field enters the minor is displaced from an optical axis of an optical system including the minor, and
wherein the measuring unit measures the incident position in an optical axis direction based on at least three measurement points in a state in which the incident position is displaced from the optical axis, and
wherein the measuring unit is provided so that, when at least three measurement points are projected onto a plane perpendicular to the optical axis, a position where the incident position is projected onto the plane and a position of center of gravity of a polygon whose vertices are formed by the projected measurement points coincide with each other.

2. An optical element positioning apparatus according to claim 1,
wherein the polygon is an isosceles triangle and a ratio of sides of the isosceles triangle is $\sqrt{5}:\sqrt{5}:1$.

3. An optical element positioning apparatus comprising:
a moving unit including an optical element;
a driving unit configured to drive the moving unit;
a measuring unit configured to measure a position of the optical element; and
a control unit configured to control the driving unit based on a measurement result by the measuring unit,
wherein an incident position at which a principal ray of a central field enters the optical element is displaced from an optical axis of an optical system including the optical element,
wherein the measuring unit is provided so that, when at least three measurement points are projected onto a plane perpendicular to the optical axis, a position where the incident position is projected onto the plane and a position of center of gravity of a polygon whose vertices are formed by the projected measurement points coincide with each other, and
wherein the measuring unit measures the incident position in an optical axis direction based on the at least three measurement points in a state in which the incident position is displaced from the optical axis.

4. An optical element positioning apparatus comprising:
a moving unit including an optical element;
a driving unit configured to drive the moving unit;
a measuring unit configured to measure a position of the optical element; and
a control unit configured to control the driving unit based on a measurement result by the measuring unit,
wherein an incident position at which a principal ray of a central field enters the optical element is displaced from an optical axis along a first direction of an optical system including the optical element toward a second direction which is perpendicular to the first direction,
wherein the measuring unit is provided so that, when at least three measurement points are projected onto a plane perpendicular to the optical axis, a distance between a position where the incident position is projected onto the plane and a position of center of gravity of a polygon whose vertices are formed by the projection measurement points is in a range of equal to or less than ¼ of a length of the optical element in a third direction perpendicular to the first and the second directions, and
wherein the measuring unit measures the incident position in the first direction based on the at least three measurement points in a state in which the incident position is displaced from the optical axis.

* * * * *